(12) United States Patent
Ozaki et al.

(10) Patent No.: US 8,492,791 B2
(45) Date of Patent: Jul. 23, 2013

(54) OPTICAL SEMICONDUCTOR DEVICE

(75) Inventors: Takashi Ozaki, Osaka (JP); Takashi Kondo, Osaka (JP); Koji Akazawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 16 days.

(21) Appl. No.: 13/325,850

(22) Filed: Dec. 14, 2011

(65) Prior Publication Data
US 2012/0153345 A1   Jun. 21, 2012

(30) Foreign Application Priority Data
Dec. 15, 2010   (JP) .................................. 2010-279496

(51) Int. Cl.
*H01L 29/66* (2006.01)
*H01L 21/00* (2006.01)

(52) U.S. Cl.
USPC ................. 257/100; 438/26; 438/29; 438/31; 438/116

(58) Field of Classification Search
USPC .......................... 257/100; 438/26, 29, 31, 116
See application file for complete search history.

(56) References Cited

U.S. PATENT DOCUMENTS

| | | | | |
|---|---|---|---|---|
| 2005/0224829 A1* | 10/2005 | Negley et al. | .................. | 257/99 |
| 2006/0094137 A1* | 5/2006 | Yan | ................................. | 438/21 |
| 2010/0163914 A1* | 7/2010 | Urano | ............................. | 257/98 |

FOREIGN PATENT DOCUMENTS

| JP | 2007250817 A | 9/2007 |
|---|---|---|
| JP | 2009130299 A | 6/2009 |

* cited by examiner

*Primary Examiner* — Fernando L Toledo
*Assistant Examiner* — Karen Kusumakar
(74) *Attorney, Agent, or Firm* — Sughrue Mion, PLLC

(57) ABSTRACT

The present invention relates to an optical semiconductor device including: a substrate having mounted thereon an LED chip; an encapsulation resin layer embedding the LED chip; an inorganic high-heat conductive layer; and a wavelength conversion layer containing an inorganic phosphor powder, in which the encapsulation resin layer, the inorganic high-heat conductive layer and the wavelength conversion layer are laminated in this order on the substrate either directly or indirectly.

9 Claims, 1 Drawing Sheet

OPTICAL SEMICONDUCTOR DEVICE

FIELD OF THE INVENTION

The present invention relates to an optical semiconductor device. In particular, the present invention relates to an optical semiconductor device including an LED (light emitting diode) and having an excellent heat dissipating property, and a method for manufacturing the optical semiconductor device.

BACKGROUND OF THE INVENTION

Recently, white light emitting diodes (LEDs) are in the spotlight as a new lighting source achieving a substantial energy saving. A white LED device is manufactured by combining a GaN-based LED chip emitting blue light and a phosphor excited by the LED light to emit the light having a different wavelength from the LED light.

Recently, high-power white LEDs are being developed for general lightings or special lightings such as the headlights for vehicles. The high-power white LEDs have a local heat problem in a wavelength conversion member, such that various studies have been conducted for the heat dissipating property of the LED.

For example, in Patent Document 1 where the lens cover of the LED chip is formed with material that does not have an organic material, heat resistance of the lens cover is improved and heat conductivity is relatively high at 0.9 W/mK or more. In Patent Document 2, a light diffusing material is disposed at a predetermined position of a color conversion member (wavelength conversion member), such that the necessary amount of the light diffusing material can be reduced as compared with the case where the light diffusing material is distributed throughout the entire wavelength conversion member. In addition, concentration of the light flux of the LED is relaxed, such that the local heat of the wavelength conversion member can be prevented.

Patent Document 1: JP-A-2007-250817
Patent Document 2 JP-A-2009-130299

SUMMARY OF THE INVENTION

In Patent Document 1, the lens cover has a heat conductivity of 0.9 W/mK or more, but is still not satisfactory for a high-power LED. In Patent Document 2, since the color conversion member (a wavelength conversion member) includes phosphor particles and the light diffusing material, the heat conductivity is not sufficiently high. Accordingly, the optical semiconductor device having a more excellent heat dissipating property is demanded.

The present invention has been made in an effort to provide an optical semiconductor device having a high heat dissipating property and a method for manufacturing the optical semiconductor device.

Accordingly, the present invention relates to the following items 1 to 9.

1. An optical semiconductor device including:
a substrate having mounted thereon an LED chip;
an encapsulation resin layer embedding the LED chip;
an inorganic high-heat conductive layer; and
a wavelength conversion layer containing an inorganic phosphor powder,
in which the encapsulation resin layer, the inorganic high-heat conductive layer and the wavelength conversion layer are laminated in this order on the substrate either directly or indirectly.

2. The optical semiconductor device according to item 1, in which the inorganic high-heat conductive layer comprises yttrium aluminate (YAG).

3. The optical semiconductor device according to item 1, in which the inorganic high-heat conductive layer comprises a glass.

4. The optical semiconductor device according to any one of items 1 to 3, in which the encapsulation resin layer contains silica fine particles.

5. The optical semiconductor device according to any one of items 1 to 4, in which the inorganic high-heat conductive layer has a heat conductivity of 1.0 W/mK or more.

6. The optical semiconductor device according to any one of items 1 to 5, in which the encapsulation resin layer includes a silicone resin.

7. The optical semiconductor device according to any one of items 1 to 6, in which the wavelength conversion layer includes a silicone resin.

8. The optical semiconductor device according to any one of items 1 to 7, in which the inorganic high-heat conductive layer has a thickness of 10 to 1000 µm.

9. A method for manufacturing an optical semiconductor device, the method including:
forming a wavelength conversion layer and an inorganic high-heat conductive layer in this order in a concave mold;
filling an encapsulation resin on the inorganic high-heat conductive layer;
disposing a substrate having mounted thereon an LED chip on the encapsulation resin so as to embed the LED chip in the encapsulation resin; and encapsulating the LED chip.

Since the optical semiconductor device of the present invention has an excellent heat dissipating property, it is suitable as high-power white LED devices.

BRIEF DESCRIPTION OF THE DRAWINGS

In FIG. 2, the left side shows a state where a composition resin solution of an encapsulation resin layer embedding an LED chip, an inorganic high-heat conductive layer and a wavelength conversion layer containing an inorganic phosphor powder are disposed in a concave mold, the center shows a state where the LED chip is encapsulated, and the right side shows a state where the concave mold is removed.

DETAILED DESCRIPTION OF THE INVENTION

Figure 1:
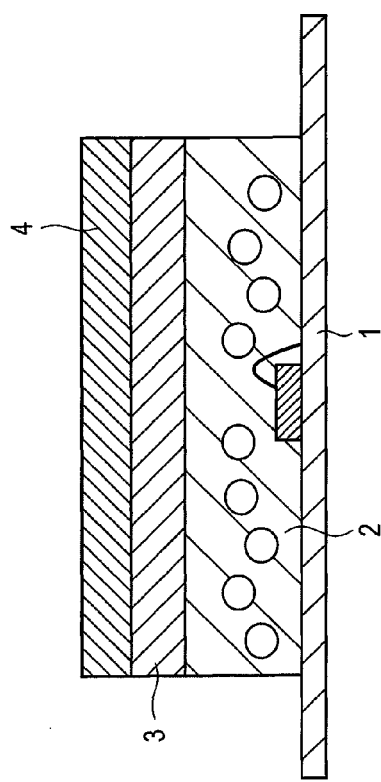
FIG. 1 is a view illustrating an optical semiconductor device according to an embodiment of the present invention.

An optical semiconductor device of the present invention includes a substrate having mounted thereon an LED chip; an encapsulation resin layer embedding the LED chip; an inorganic high-heat conductive layer; and a wavelength conversion layer containing an inorganic phosphor powder, in which the encapsulation resin layer, the inorganic high-heat conductive layer and the wavelength conversion layer are laminated in this order on the substrate either directly or indirectly. In this specification, the state where the encapsulation resin layer, the inorganic high-heat conductive layer, and the wavelength conversion layer are "directly laminated" represents the state where the inorganic high-heat conductive layer and the wavelength conversion layer are directly laminated or disposed on the encapsulation resin layer in sequence. The state where the encapsulation resin layer, the inorganic high-heat conductive layer, and the wavelength conversion layer are "indirectly laminated" represents the state where any other resin layer (for example, a resin layer containing light diffusion particles) is laminated or disposed between the encapsulation resin layer and the inorganic high-heat conductive layer and/or between the inorganic high-heat conductive layer and the wavelength conversion layer.

The inorganic phosphor is excited by the light emitted from the LED chip to emit the wavelength-converted light. In this case, loss energy of the inorganic phosphor is absorbed in the wavelength conversion layer, such that the temperature of the wavelength conversion layer increases. However, when there exists a low heat conductivity layer around the wavelength conversion layer, the heat of the wavelength conversion layer is not diffused, such that the temperature of the optical semiconductor device increases, thereby causing deterioration of an encapsulation material and the like. Meanwhile, in order to improve luminance of a device, the wavelength conversion layer may be disposed at the outermost layer of an encapsulation part including the wavelength conversion layer, the encapsulation resin layer, or the like. As a result, in the present invention, a heat conductive layer including an inorganic material having high heat conductivity is disposed between the wavelength conversion layer and the encapsulation resin layer embedding the LED chip. That is, the heat generated from the wavelength conversion layer is transferred from the heat conductive layer to the encapsulation resin layer and the substrate in sequence so as to be easily dissipated, such that the heat dissipating property of the optical semiconductor device is enhanced and the deterioration of the encapsulation part is prevented, thereby increasing durability of the device.

A configuration of the optical semiconductor device according to the present invention will be described with reference to FIG. 1. As described below, there is a case where integration of the encapsulation resin layer, the inorganic high-heat conductive layer, and the wavelength conversion layer is called the encapsulation part in the optical semiconductor device according to the present invention.

In FIG. 1, reference numeral 1 represents a substrate on which the LED chip is mounted.

In the present invention, the LED chip (an optical semiconductor element) is not particularly limited as long as the LED chip is generally used for the optical semiconductor device and for example, may be gallium nitride (GaN, refractive index: 2.5), gallium phosphorus (GaP, refractive index: 2.9), gallium arsenic (GaAs, refractive index: 3.5), and the like. Of these, GaN is preferable from the viewpoint that it can emit ultraviolet light to blue region in visible light and is capable of manufacturing the white LED by the phosphor.

The substrate on which the LED chip is mounted is not particularly limited, but for example, may be a metallic substrate, a rigid substrate laminating a copper wiring on a glass-epoxy substrate, a flexible substrate laminating a copper wiring on a polyimide film, and the like, and may be used even as any form such as a flat plate, an uneven plate, and the like.

A method for mounting the LED chip on the substrate may be a face-up mounting method suitable for mounting an LED chip where an electrode is disposed on an emission surface thereof, or a flip-chip mounting method suitable for mounting an LED chip where an electrode is disposed on an opposite surface to the emission surface.

In FIG. 1, reference numeral 2 represents the encapsulation resin layer embedding the LED chip.

A resin constituting the encapsulation resin layer is not particularly limited as long as the resin has been used conventionally to encapsulate the optical semiconductor and may be a thermosetting transparent resin such as a silicone resin, an epoxy resin and the like, and be used either alone or in combination of two or more thereof. Among these resins, the silicone resin may be preferably used in view of heat resistance and light resistance. The resins may be a commercial product or a product synthesized according to a known method.

In the present invention, in order to improve the light diffusion, the light diffusing particles may be dispersed in the encapsulation resin layer.

The light diffusing particles may be, for example, transparent inorganic fine particles such as silica, titania, alumina, and the like. Among these particles, the inorganic fine particles having a refractive index of 1.4 or more, for example, the silica fine particles may be preferably used because a diffusing effect is increased as the refractive index increases.

An average particle diameter of the light diffusing particles is preferably 0.5 to 60 μm, and more preferably 1.0 to 50 μm in order to prevent a rear light scattering loss. The shape of the light diffusing particles may be a spherical shape in order to prevent light loss according to the light diffusion. In this specification, the average particle diameter of the particles may be measured according to a method disclosed in Examples to be described below.

The content of the light diffusing particles in the encapsulation resin layer is preferably 1 wt % or more, and more preferably 10 wt % or more in order to improve the heat dissipating property. Since transparency of the encapsulation resin layer becomes excellent, the content thereof is preferably 70 wt % or less, and more preferably 60 wt % or less. Accordingly, the content of the light diffusing particles in the encapsulation resin layer is preferably 1 to 70 wt %, and more preferably 10 to 60 wt %.

The encapsulation resin layer according to the present invention may include additives such as a curing agent, a curing accelerator, an aging inhibitor, a denaturant, a surfactant, a pigment, a dye, a discoloration inhibitor, an ultraviolet absorber, and the like other than the light diffusing particles.

The encapsulation resin layer may be a commercial product or a product synthesized according to a known method. However, for example, when the composition resin is a liquid type, the encapsulation resin layer may be formed by molding the composition resin, or the composition resin in which the light diffusing particles are dispersed if necessary, in a layered form by heat generating when the LED chip is encapsulated during the manufacturing the optical semiconductor device.

The thickness of the encapsulation resin layer is preferably 300 to 5000 μm, and more preferably 500 to 3000 μm in view of heat resistance and the encapsulation property of the LED chip.

In FIG. 1, reference numeral 3 represents the inorganic high-heat conductive layer which refers to a layer having high heat conductivity formed by an inorganic material, and intrinsically refers to a heat conductive layer formed by the inorganic material having high heat conductivity.

The inorganic material constituting the inorganic high-heat conductive layer is not particularly limited as long as the inorganic material has high heat conductivity, and for example, may be transparent ceramics such as yttrium aluminates (YAG; without an activating agent such as Ce, and the like), glass, and the like.

The layer formed with the inorganic material may be a commercial product or a product synthesized according to a known method. For example, the inorganic high-heat conductive layer may be manufactured by adding additives such as a binder resin, a dispersant, a sintering aid, and the like, to a desired inorganic material, wet-mixing the inorganic material with the additives under the presence of a solvent to manufacture a slurry solution, and then, molding the obtained slurry solution and heat-sintering. Known additives in the art such as the binder resin, the dispersant, the sintering aid, and the like may be used as the additives without particular limitation as long as the additives are decomposed and removed by the heat-sintering. These raw materials may be mixed in the heat conductive layer as long as the range does not impair the effect of the present invention, but these raw materials are preferably completely removed by the heat-sintering.

The thickness of the inorganic high-heat conductive layer is preferably 10 to 1000 μm, and is more preferably 30 to 800 μm in view of the heat dissipating property.

The heat conductivity of the obtained inorganic high-heat conductive layer is preferably 1.0 W/mK or more, and more preferably 10 W/mK or more in view of the heat dissipating property of the optical semiconductor device.

In the present invention, in order to reduce the total necessary amount of the inorganic material constituting the inorganic high-heat conductive layer, the inorganic high-heat conductive layer may not be uniform according to the size of the optical semiconductor device, but for example, may be used by cutting at, for example, preferably 2-20 mm×2-20 mm (square)×0.05-1 mm (height), and at more preferably 5-15 mm×5-15 mm (square)×0.10-0.8 mm (height).

In FIG. 1, reference numeral 4 represents the wavelength conversion layer containing the inorganic phosphor powder. Since the wavelength conversion layer is disposed at the outermost layer of the encapsulation part, the optical semiconductor device according to the present invention may increase the light extraction efficiency from the LED chip.

A resin constituting the wavelength conversion layer may be the same as the resin constituting the encapsulation resin layer. Among the resins, the silicone resin is preferably used in view of heat resistance and light resistance. The resins may be a commercial product or a product synthesized according to a known method.

The inorganic phosphor is not particularly limited as long as the inorganic phosphor can convert the light emission from the LED chip to light having a longer wavelength than that of the LED light and may use a conventionally known phosphor used in the optical semiconductor device. Specifically, a commercial phosphor suitable for a function converting blue into yellow may be, for example, YAG, TAG, α-sialon, and the like.

The inorganic phosphor powder is not particularly limited as long as the inorganic phosphor is in a powder shape, but in view of quantum efficiency and a light scattering property of the phosphor, an average particle diameter of the powder is preferably 0.1 to 200 and is more preferably 1 to 50 μm.

The content of the inorganic phosphor powder in the wavelength conversion layer is not uniformly determined because the degree of whitening is different according to a kind of the phosphor and the thickness of the wavelength conversion layer. However, the content thereof is preferably 1 to 70 wt %, and more preferably 10 to 60 wt %.

The wavelength conversion layer of the present invention may include additives such as a curing agent, a curing accelerator, an aging inhibitor, a denaturant, a surfactant, a pigment, a discoloration inhibitor, an ultraviolet absorber, and the like in addition to the above materials.

The wavelength conversion layer may be a commercial product or a product synthesized according to a known method. For example, the resin solution containing the inorganic phosphor powder is coated on a release sheet (for example, a polyethylene substrate) in which the surface thereof has been release-treated, by an applicator etc. with a predetermined thickness, followed by heating at a certain temperature thereby drying the coated resin solution to mold the wavelength conversion layer.

The thickness of the wavelength conversion layer is preferably 50 to 1000 μm, and more preferably 100 to 300 μm in view of the heat dissipating property.

The area of the wavelength conversion layer is preferably 2-20 mm×2-20 mm (square), and more preferably 5-15 mm×5-15 mm (square). In the present invention, the encapsulation resin layer, the inorganic high-heat conductive layer, and the wavelength conversion layer may have different thicknesses, but preferably have the same size (area).

As described above, the optical semiconductor device according to the present invention has the above constitution, but hereinafter, a method for manufacturing the optical semiconductor device according to the present invention will be described with reference to FIG. 2. Accordingly, the present invention further provides the method for manufacturing the optical semiconductor device according to the present invention.

Figure 2:
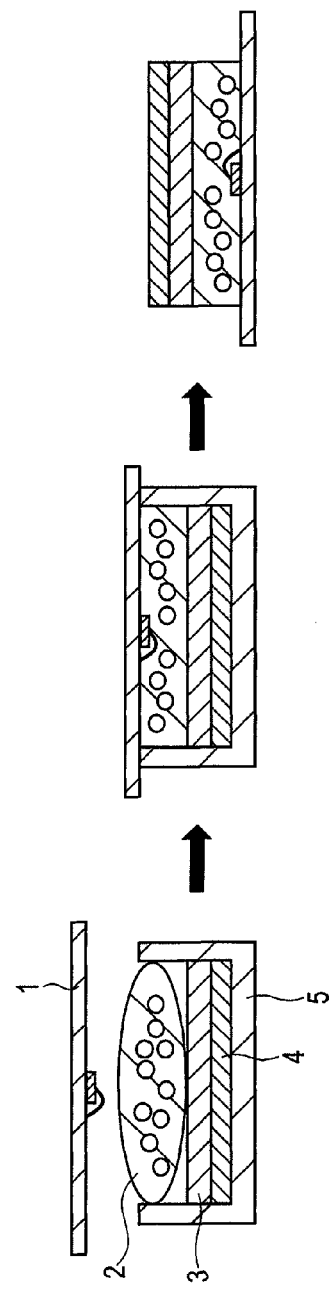
FIG. 2 is a view illustrating a method for manufacturing an optical semiconductor device according to an embodiment of the present invention in detail.

First, the encapsulation part is disposed in a concave mold 5 (see the left side of FIG. 2). That is, the wavelength conversion layer and the inorganic high-heat conductive layer are formed on the bottom of the concave mold in this order. In this case, the wavelength conversion layer and the inorganic high-heat conductive layer, which are manufactured in advance in a layered shape, respectively, may be disposed by adjusting the sizes so as to have a size of the bottom of the concave mold, or the wavelength conversion layer may be formed by injecting the composition resin solution of the wavelength conversion layer into the bottom of the concave mold and heating and drying the composition resin solution and then, the separately manufactured inorganic high-heat conductive layer may be laminated thereon. Thereafter, for example, when the composition resin of the encapsulation resin layer is liquid, the composition resin solution is filled on the disposed inorganic high-heat conductive layer after the light diffusing particles are dispersed therein, if necessary.

Next, the substrate on which the LED chip is mounted is disposed on the filled encapsulation resin layer so that the LED chip faces the encapsulation resin layer, followed by encapsulating (see the center of FIG. 2).

The heating temperature of the encapsulation process is preferably 80 to 200° C., and is more preferably 80 to 150° C. The heating time is preferably 0.5 to 10 min, and more preferably 0.5 to 5 min. In order to prevent bubbles from being mixed into the encapsulation resin layer, the encapsulation process may be performed under a reduced pressure.

Thereafter, the molded package is left as it is until the shape thereof is not changed even under room temperature and then, the mold is removed, whereby the optical semiconductor device according to the present invention can be obtained (see the right side of FIG. 2). Incidentally, a post-curing may be performed by heating and pressuring until a required time for curing the encapsulation resin layer.

Since the thus-obtained optical semiconductor device according to the present invention has light transmittance of 90% or more for an incident light of a visible light range of 380 to 780 nm, the deterioration in luminance as the white LED device does not occur even when the inorganic high-heat conductive layer is laminated.

EXAMPLES

Hereinafter, the present invention will be described in detail based on Examples, Comparative Example, and Reference Example, but the present invention is not limited to the above Examples.

[Average Particle Diameter of Light Diffusing Particles and Inorganic Phosphor]

Average particle diameters of the light diffusing particles and the inorganic phosphor refer to average particle diameters of primary particles of the light diffusing particles and the inorganic phosphor. That is, diameters of 100 particles reflected to an image are measured by a transmission electron microscope (TEM) and an average value of the diameters is taken as an average particle diameter.

Example 1

Wavelength Conversion Layer

A cerium-activated YAG:$Ce^{3+}$ (average particle diameter: 9 μm) was added and mixed to a commercial silicone elastomer LR7665 (manufactured by Wacker Asahikasei Silicone Co., Ltd.) so as to have 26 wt %. Then, the mixture was coated on a PET film (thickness of 50 μm) by an applicator with a thickness of 100 μm, and heated and molded at a temperature of 100° C. for 5 minutes. The thus-obtained molded body was cut into small pieces having a size of 8 mm×8 mm (thickness of about 100 μm) by a trimming die molding apparatus, thereby manufacturing the wavelength conversion layer.

(Inorganic High-Heat Conductive Layer)

A slurry solution was fabricated by adding polyvinylalcohol as the binder resin to yttrium aluminates (YAG) (average particle diameter: 9 μm) so that the weight of the corresponding inorganic material was 20 wt % and by further adding the optimum amount of isopropylalcohol. Subsequently, the inorganic high-heat conductive layer was manufactured by molding the thus-obtained slurry solution and heating and sintering the molded slurry solution at 1000° C. for 5 hours so that the thickness after the sintering is 500 μm. The obtained inorganic high-heat conductive layer was sufficiently cooled and then, was cut into a size of 8 mm×8 mm by using the trimming die molding apparatus.

(Optical Semiconductor Device)

The obtained wavelength conversion layer and inorganic high-heat conductive layer were disposed on the bottom of the concave mold (the bottom size of 8×8 mm and the height of 1.1 mm) in sequence and molten silica particles FB-40S (manufactured by Denki Kagaku Kogyo Kabushiki Kaisha, average particle diameter: 40 μm) which is added and mixed into a commercial silicone elastomer LR7665 as the encapsulation resin layer so as to have 50 wt % was filled thereon. The substrate on which a blue LED chip (1 mm×1 mm×0.17 mm height) was mounted was disposed thereon so that the filled resin and the LED chip face each other and then, heated at 160° C. for 5 minutes to be encapsulated. Thereafter, the substrate was left as it is until the shape is not changed even under room temperature and then, the mold was removed, thereby manufacturing the optical semiconductor device.

Example 2

The optical semiconductor device was manufactured in the same manner as Example 1, except that the inorganic high-heat conductive layer in Example 1 is changed as described below.

(Inorganic High-Heat Conductive Layer)

The slurry solution was fabricated by adding polyvinylalcohol as the binder resin to glass (average particle diameter: 5 μm) so that the weight of the corresponding inorganic material is 20 wt % and by further adding the optimum amount of isopropylalcohol. Subsequently, the inorganic high-heat conductive layer was manufactured by molding the thus-obtained slurry solution and then, heating and sintering the molded slurry solution at 800° C. for 5 hours so that the thickness after the sintering becomes 35 μm. The obtained inorganic high-heat conductive layer was sufficiently cooled and then, was cut into a size of 8 mm×8 mm by using the trimming die molding apparatus.

Example 3

The optical semiconductor device was manufactured with the same manner as Example 1, except that the molten silica particles are not added to the encapsulation resin layer in Example 1.

Example 4

The optical semiconductor device was manufactured with the same manner as Example 2, except that the molten silica particles are not added to the encapsulation resin layer in Example 2.

Example 5

The optical semiconductor device was manufactured with the same manner as Example 1, except that the thickness of the inorganic high-heat conductive layer in Example 1 is changed from 500 μm to 300 μm.

Comparative Example 1

The optical semiconductor device was manufactured with the same manner as Example 1, except that the inorganic high-heat conductive layer is not used in Example 1.

Comparative Example 2

The optical semiconductor device was manufactured with the same manner as Example 1, except that the inorganic high-heat conductive layer in Example 1 is changed to an inorganic low-heat conductive layer as described below.

(Inorganic Low-Heat Conductive Layer)

The inorganic low-heat conductive layer was manufactured by coating a commercial silicone elastomer LR7665 on a PET film (thickness: 50 μm) with a thickness of 100 μm by using an applicator, heating at 150° C. for 5 minutes to be molded, and then, cut into small pieces having a size of 8 mm×8 mm (a thickness: about 100 μm) by using a trimming die molding apparatus.

Reference Example 1

The optical semiconductor device (including only the encapsulation resin layer) was manufactured in the same manner as Example 1, except that the inorganic high-heat conductive layer and the wavelength conversion layer in Example 1 are not used.

Characteristics for the obtained optical semiconductor device were evaluated according to Test Examples 1 to 3 to be described below. The evaluation results thereof were shown in Tables 1 and 2.

Test Example 1

Maximum Temperature

A maximum temperature of the optical semiconductor device for input current 1 A was measured by using a contactless radiation thermometer (manufactured by Chino Corporation).

Test Example 2

Stimulus Value Y and xy Chromaticity

A stimulus value Y of the optical semiconductor device for input current 1 A and an xy chromaticity diagram CIE1931 in an XYZ color coordinate system were measured by using an instant multi-photometric system MCPD-3000 (manufactured by Otsuka Electronics Co. Ltd.). The stimulus value Y is an index in luminance of the optical semiconductor device, and with the input current 1 A, the luminance is excellent when the stimulus value Y is 18000 or more.

Test Example 3

Light Transparency

Light transmittance for a wavelength of 560 nm was measured by using an ultraviolet-visible spectrum measuring device U4100 (manufactured by Hitachi Co., Ltd.) to measure light transparency.

As a result, the maximum temperature in the optical semiconductor device of Examples with an input of 1 A was significantly low as compared with the optical semiconductor device of Comparative Example 1 in which the inorganic high-heat conductive layer is not provided or Comparative Example 2 in which the inorganic low-heat conductive layer is provided. From this, it can be understood that the heat generated from the wavelength conversion layer was heat-conducted to the inorganic high-heat conductive layer to be dissipated. Since the maximum temperatures with an input of 1 A were almost the same in Example 1 and Reference Example 1, the heat generated from the wavelength conversion layer was almost entirely heat-conducted to be dissipated in the optical semiconductor device of Example 1. In the optical semiconductor devices of Examples 1 to 5, since the heat conductive layers were transparent, chromaticity or luminance was not deteriorated.

While the invention has been described in detail with reference to specific embodiments thereof, it will be apparent to

TABLE 1

| | | | Example 1 | Example 2 | Example 3 | Example 4 | Example 5 |
|---|---|---|---|---|---|---|---|
| Composition of encapsulation part | Encapsulation resin layer | Composition | Silicone elastomer containing silica | Silicone elastomer containing silica | Silicone elastomer without silica | Silicone elastomer without silica | Silicone elastomer containing silica |
| | Heat conductive layer | Composition material | YAG | Glass | YAG | Glass | YAG |
| | | Thickness of layer (μm) | 500 | 35 | 500 | 35 | 300 |
| | | Heat conductivity (W/mK) | 10 | 1.0 | 10 | 1.0 | 10 |
| | Wavelength conversion layer | Composition | Silicone elastomer containing YAG:Ce | Silicone elastomer containing YAG:Ce | Silicone elastomer containing YAG:Ce | Silicone elastomer containing YAG:Ce | Silicone elastomer containing YAG:Ce |
| Characteristics | Maximum temperature (° C.) | | 58.6 | 159 | 80 | 178 | 100 |
| | Stimulus value Y | | 19000 | 20150 | 19500 | 20500 | 19500 |
| | xy chromaticity (CIE1931) | | 0.32, 0.35 | 0.32, 0.35 | 0.32, 0.35 | 0.32, 0.35 | 0.32, 0.35 |
| | Light transmittance (%) | | 91 | 99 | 91 | 99 | 93 |

TABLE 2

| | | | Comparative Example 1 | Comparative Example 2 | Reference Example 1 |
|---|---|---|---|---|---|
| Composition of encapsulation part | Encapsulation resin layer | Composition | Silicone elastomer containing silica | Silicone elastomer containing silica | Silicone elastomer containing silica |
| | Heat conductive layer | Composition material | — | Silicone elastomer | — |
| | | Thickness of layer (μm) | — | 100 | — |
| | | Heat conductivity (W/mK) | — | 0.1 | — |
| | Wavelength conversion layer | Composition | Silicone elastomer containing YAG:Ce | Silicone elastomer containing YAG:Ce | — |
| Characteristic | Maximum temperature (° C.) | | 207 | 200 | 60.2 |
| | Stimulus value Y | | 19600 | 20000 | — |
| | xy chromaticity (CIE1931) | | 0.32, 0.35 | 0.32, 0.35 | 0.14, 0.04 |
| | Light transmittance (%) | | 99 | 99 | 99 | one skilled in the art that various changes and modifications can be made therein without departing from the spirit and scope thereof.

Incidentally, the present application is based on Japanese Patent Application No. 2010-279496 filed on Dec. 15, 2010, and the contents are incorporated herein by reference.

All references cited herein are incorporated by reference herein in their entirety.

Also, all the references cited herein are incorporated as a whole.

The optical semiconductor device according to the present invention is used suitably for a high power use, such as a general illumination using the LED as a light emission source, a backlight of a display and a head light of a vehicle.

| Description of Reference Numerals and Signs | |
|---|---|
| 1 | Substrate on which the LED chip is mounted |
| 2 | Encapsulation resin layer embedding the LED chip |
| 3 | Inorganic high-heat conductive layer |
| 4 | Wavelength conversion layer containing the inorganic phosphor powder |
| 5 | Concave mold |

What is claimed is:

1. An optical semiconductor device comprising:
a substrate having mounted thereon an LED chip;
an encapsulation resin layer embedding the LED chip;
an inorganic high-heat conductive layer; and
a wavelength conversion layer containing an inorganic phosphor powder,
wherein the encapsulation resin layer, the inorganic high-heat conductive layer and the wavelength conversion layer are laminated in this order on the substrate either directly or indirectly.

2. The optical semiconductor device according to claim 1, wherein the inorganic high-heat conductive layer comprises yttrium aluminate (YAG).

3. The optical semiconductor device according to claim 1, wherein the inorganic high-heat conductive layer comprises a glass.

4. The optical semiconductor device according to claim 1, wherein the encapsulation resin layer contains silica fine particles.

5. The optical semiconductor device according to claim 1, wherein the inorganic high-heat conductive layer has a heat conductivity of 1.0 W/mK or more.

6. The optical semiconductor device according to claim 1, wherein the encapsulation resin layer comprises a silicone resin.

7. The optical semiconductor device according to claim 1, wherein the wavelength conversion layer comprises a silicone resin.

8. The optical semiconductor device according to claim 1, wherein the inorganic high-heat conductive layer has a thickness of 10 to 1000 µm.

9. A method for manufacturing an optical semiconductor device, said method comprising:
forming a wavelength conversion layer and an inorganic high-heat conductive layer in this order in a concave mold;
filling an encapsulation resin on the inorganic high-heat conductive layer;
disposing a substrate having mounted thereon an LED chip on the encapsulation resin so as to embed the LED chip in the encapsulation resin; and
encapsulating the LED chip.

* * * * *